United States Patent
Munder et al.

(10) Patent No.: US 10,811,327 B2
(45) Date of Patent: Oct. 20, 2020

(54) DIE EDGE INTEGRITY MONITORING SYSTEM

(71) Applicant: Melexis Technologies NV, Tessenderlo (BE)

(72) Inventors: Gunnar Munder, Erfurt (DE); Heiko Grimm, Waltershausen (DE); Thomas Freitag, Plaue (DE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 16/735,117

(22) Filed: Jan. 6, 2020

(65) Prior Publication Data

US 2020/0144139 A1    May 7, 2020

Related U.S. Application Data

(62) Division of application No. 15/819,260, filed on Nov. 21, 2017.

(30) Foreign Application Priority Data

Nov. 24, 2016    (EP) .................................. 16200471

(51) Int. Cl.
  *G01R 31/28*    (2006.01)
  *H01L 21/66*    (2006.01)
  (Continued)

(52) U.S. Cl.
  CPC .......... *H01L 22/34* (2013.01); *G01R 31/2858* (2013.01); *G01R 31/2896* (2013.01);
  (Continued)

(58) Field of Classification Search
  CPC ........ G01R 31/02; G01R 31/26; G01R 31/28; G01R 31/2884; G01R 31/2896; G01R 19/00
  See application file for complete search history.

(56) References Cited

U.S. PATENT DOCUMENTS

| | | |
|---|---|---|
| 8,987,839 B2 | 3/2015 | Liu et al. |
| 9,070,683 B2 | 6/2015 | Fender et al. |
| (Continued) | | |

FOREIGN PATENT DOCUMENTS

| | | |
|---|---|---|
| CN | 104241242 A | 12/2014 |
| CN | 104241252 A | 12/2014 |

OTHER PUBLICATIONS

Chinese Office Action from corresponding Application No. 201711184128.8, dated Sep. 11, 2019.
(Continued)

*Primary Examiner* — Neel D Shah
(74) *Attorney, Agent, or Firm* — Workman Nydegger

(57) ABSTRACT

An edge crack monitoring system for an integrated circuit provided on a die, comprises a conductive trace comprising at least a first conductive path for allowing current in a first direction, and a second adjacent conductive path for allowing current in a second direction opposite to the first direction. Both adjacent conductive paths form at least one loop surrounding a semiconductor device on a die. The arrangement of the trace is adapted to provide compensation of EM interferences. The trace comprises two terminals being connectable to a detection circuit for detecting damages by generating a fault signal upon detection of disruption of the conductive trace due to a damage. The conductive trace comprises high resistance portions with a resistance of at least 1 kΩ, adapted for reducing self-resonance.

4 Claims, 3 Drawing Sheets

(51) Int. Cl.
*H01L 23/66* (2006.01)
*H01L 23/64* (2006.01)
*H01L 23/00* (2006.01)

(52) U.S. Cl.
CPC .......... *H01L 23/562* (2013.01); *H01L 23/645* (2013.01); *H01L 23/66* (2013.01); *H01L 2223/6677* (2013.01)

(56) References Cited

U.S. PATENT DOCUMENTS

| | | |
|---|---|---|
| 2009/0174426 A1 | 7/2009 | Matoba et al. |
| 2013/0009663 A1 | 1/2013 | Gauch et al. |
| 2014/0361417 A1 | 12/2014 | Liu et al. |
| 2014/0375341 A1* | 12/2014 | Fender .................. H01L 23/585 324/693 |
| 2015/0115993 A1 | 4/2015 | Wang et al. |
| 2016/0043011 A1 | 2/2016 | Xie et al. |
| 2016/0195581 A1* | 7/2016 | Dennison ................ H01L 22/34 324/762.02 |
| 2016/0197056 A1 | 7/2016 | Bhowmik et al. |
| 2018/0025730 A1* | 1/2018 | Giletti .................... G10L 15/142 704/246 |

OTHER PUBLICATIONS

Extended European Search Report from EP Application No. EP 16200471, dated Feb. 22, 2017.

* cited by examiner

DIE EDGE INTEGRITY MONITORING SYSTEM

FIELD OF THE INVENTION

The invention relates to the field of semiconductor integrated electronics. More specifically it relates to methods and devices for monitoring and detection of damages in semiconductor die edges under the aspect of safety.

BACKGROUND OF THE INVENTION

During manufacture of integrated circuits, a semiconductor wafer is processed in order to provide a plurality of electronic chips. The number of chips, that a wafer can provide, depends of the area per chip and the total area of the wafer, which is dictated by industrial trends and technology. It is commercially important to obtain a high chip yield per wafer. However, the dice are required to be cut and separated. It is known that during the separation of semiconductor devices from the wafer the die edge may crack or otherwise become damaged during manufacturing. This may happen also during handling (e.g. during assembly in a larger circuit) or even during use, depending on the conditions and particular application. It is also known that during the separation of the devices from the wafer, any small imperfection along the die edge may give rise to damages, for instance to cracks or other mechanical failures. Even if these damages are small and do not reach the metallic layers of the chip, cracks might further expand during other manufacturing stages, or in qualification of the integrated circuit and handling, or during its lifetime, especially in thermally, mechanically or chemically harsh environments as for instance automotive applications. The cracks may introduce defects in the structure and damage the metallization layers, as well as being a path for further damage if corrosive or harsh gasses and chemicals enter the cracks. The function of the semiconductor device might be disturbed. Thus, cracks and damages may produce a total failure of a semiconductor device, disturb its function, or at least cause relevant parametric deviation.

There is therefore a need to control such cracks or damages in an early stage, before they might arrive in the active functional area of the chip. As an example, ISO26262 requires a failure signal to be used by a higher-level system, such that if a failure occurs during the lifetime of an IC, the higher-level system can take adequate measures.

Many devices contain passive measures to improve cutting and reduce the influence of any damage in the semiconductor material. For example, passive means include introducing extra electronics-free area around the scribe lines. This makes damages less likely to reach electronic components in the die. However, it requires more area per die in the semiconductor wafer, thus reducing yield, which is undesirable. Alternatively or additionally, active electronic components can be used for monitoring the integrity of the edge during cutting. The area around the scribe lines can be reduced in this way. However, the monitoring is limited to cutting or, in the best case, to handling. Any damage occurring afterwards (e.g. during use in a harsh environment) will be unnoticed. The compromised integrated circuit may create malfunction in the whole system.

US2013009663A1 shows a semiconductor device comprising a conductive line surrounding circuitry, and connected to two terminals and a test circuit. This system is not appropriate for many sensitive applications in which any electromagnetic disturbance needs to be avoided. Additionally, the system itself may be susceptible of malfunction due to peak currents and/or antenna effects. Adding further electronic circuit elements (such as inductive coils or capacitors) to improve shielding is possible, but this also increases the area of the chip and reduces manufacturing yield, both of which are commercial disadvantages.

US2014375341A1 shows a crack testing system comprising conductive paths with gaps and bridges for shielding the system against humidity. Cracks are detected by introducing an electric signal and measuring changes thereof. The gaps of the inner ring are offset with the gaps of the outer ring, in order to provide simultaneous protection against humidity and good crack detection. As in the case of US2013009663A1, electromagnetic shielding is necessary.

US2016197056A1 discloses a double conductive path sectioned in several portions for protection of a die against cracks which can also be used to monitor cracks. However, the applications of such system are limited, because the paths may catch stray signals and interferences and give false readings.

US2015115993A1 discloses at least one double conductive loop for a circuit stack, which is suitable to detect delamination of stacked dies by detection of electric changes in the conductive path. As with the previous systems, this system is susceptible of interferences, and it is not suitable for a single die.

SUMMARY OF THE INVENTION

It is an object of embodiments of the present invention to provide a good and reliable integrity monitoring system for detection of edge damages in a semiconductor chip, suitable for functional safety applications during the lifetime of the semiconductor chip.

In a first aspect, the present invention provides an edge crack monitoring system for an integrated circuit provided on a die. The monitoring system comprises a conductive trace comprising at least a first conductive path for allowing current in a first direction, and a second adjacent conductive path for allowing current in a second direction opposite to the first direction, both adjacent conductive paths forming at least one loop surrounding a semiconductor device on a die. The arrangement of the trace is adapted to provide compensation of EM interferences. The trace comprises two terminals being connectable to a detection circuit for detecting damages by generating a fault signal upon detection of disruption of the conductive trace due to a damage. The conductive trace comprises high resistance portions with a resistance of at least 1 k$\Omega$, for instance at least 2 k$\Omega$, for instance a few k$\Omega$, adapted for reducing self-resonance. Self-resonance can be easily suppressed or reduced, or even avoided, further reducing interference and ringing. Although the conductive path can be defined using conductive material such as metals, for instance metals used for routing layers, such as for instance Aluminium, Copper, Gold, NiPd, also semiconductors can be used for forming the conductive path, with no need of metal deposition or sputtering, It is an advantage of embodiments of the present invention that reliable crack detection can be obtained if the conductive trace is broken, with little or no susceptibility of being influenced by external electromagnetic fields. It is a further advantage that the system has a reduced or null unwanted electromagnetic emission.

In a monitoring system according to embodiments of the present invention, the conductive trace may be a bifilar trace. It is an advantage of embodiments of the present invention that a robust device is obtained against electrostatic discharge or interference due to bad electromagnetic compatibility, reducing unwanted fault signal triggering due to signal or pulse injection.

In a monitoring system according to embodiments of the present invention, the conductive trace may comprise a multi-layered stack of conductive paths. Monitoring of cracks in any or all of the layers of a multilayer structure can be obtained, either cracks spreading from top or bottom of the die. It is a further advantage that at least partial monitoring of cracking via delamination can be obtained.

In a monitoring system according to embodiments of the present invention, the conductive trace may comprise at least one coplanar loop parallel with a die surface. This way, horizontal propagation of damages such as cracks can be detected in an early stage.

In a monitoring system according to embodiments of the present invention, the conductive trace may comprise at least a coplanar loop parallel with a die surface and at least a multi-layered stack of conductive paths.

A monitoring system according to embodiments of the present invention may further comprise a current source for providing a bias current to the plurality of loops of conductive material. It is an advantage of embodiments of the present invention that a voltage comparator such as a Schmitt trigger can be used.

A monitoring system according to embodiments of the present invention may further comprise an even number of conductive paths, each surrounding the die edge, each connected to adjacent conductive paths through connecting portions, the interconnected conductive paths thus forming a single conductive trace. This way, low sensitivity against injected currents from sources of noise is obtained, further reducing or avoiding triggering of unwanted fault signals.

A monitoring system according to embodiments of the present invention may further comprise a detection circuit. In such monitoring system, the detection circuit may comprise a comparator connected to a debouncing unit. This way, unwanted signal triggering can be reduced or avoided, and the debouncing unit can suppress signal spikes. The debouncing unit can have programmable debouncing parameters. If DC is flown through the conductive trace, then the debouncing time can be programmed. If AC pulses are flown through the conductive trace, filter parameters of the debouncing unit may be programmed.

In a monitoring system according to embodiments of the present invention, the detection circuit may be adapted to detect damages and to generate a signal upon damage detection during at least the lifetime of the integrated circuit. It is an advantage of embodiments of the present invention that a reliable integrated circuit is obtained.

In a second aspect, the present invention provides an integrated circuit comprising at least one die edge monitoring system according to any of the embodiments of the first aspect. It is an advantage of embodiments of the present invention that damage, such as e.g. cracks, during manufacture or use can be reliably detected, if the conductive trace is broken.

An integrated circuit according to embodiments of the present invention may comprise an integrated detection circuit connected to the conductive trace. An integrated circuit is obtained, which can self-diagnose edge crack formation and development and which can switch to a safe state before malfunction of the system takes place.

In a third aspect, the present invention provides a method of monitoring edge integrity of a semiconductor die comprising a semiconductor device. The method comprises the steps of:

introducing, through a first conductive path surrounding a die edge, a test signal in a conductive trace comprising high resistance portions with a resistance of at least 1 kΩ, adapted for reducing self-resonance, monitoring a return test signal through a second conductive path surrounding the die edge and electrically connected to the first conductive path via an extremity, and comparing the returned signal with a reference signal, and generating a fault signal if the output of the comparison exceeds a predetermined threshold, e.g. is larger than or smaller than the threshold, depending on the polarity of the current source.

It is an advantage of embodiments of the present invention that a reliable method of crack detection is obtained, highly stable and with low chances of triggering an unwanted fault signal due to external sources of interference.

A method according to embodiments of the present invention may further comprise introducing the output of the comparison in a debouncing unit. By the debouncing unit, unwanted signal triggering can be further reduced or avoided, and the debouncing unit can suppress signal peaks. The debouncing unit can have programmable debouncing parameters. If DC is flown through the conductive trace, then the debouncing time can be programmed. If AC pulses are flown through the conductive trace, filter parameters may be programmed.

In a method according to embodiments of the present invention, introducing the test signal may comprise introducing a test current; monitoring the return test signal may comprise monitoring the voltage drop in the conductive trace; and comparing the return signal with a reference signal may comprise comparing the voltage drop with a reference voltage $V_{th}$. The reference signal may be a programmable reference signal. Embodiments of the method can be easily implemented with a Schmitt trigger and a current source.

In an alternative method according to embodiments of the present invention, introducing the test signal may comprise applying a test voltage; monitoring the return test signal may comprise measuring a reply current in the conductive trace; and comparing the return test signal with a reference signal may comprise comparing the reply current with a reference current. Forcing a voltage and measuring current is possible because the conductive loop has a relevant high-ohmic portion (>1 kOhm, as mentioned before) and is in practice not just a 'too low-ohmic' short. Forcing a voltage as test signal and measuring the current in an analog way as monitoring parameter, would give information about the resistance of the conductive trace. Aging effects of a possible damage at the die edge, what might develop further over lifetime, can be diagnosed under use of this method.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
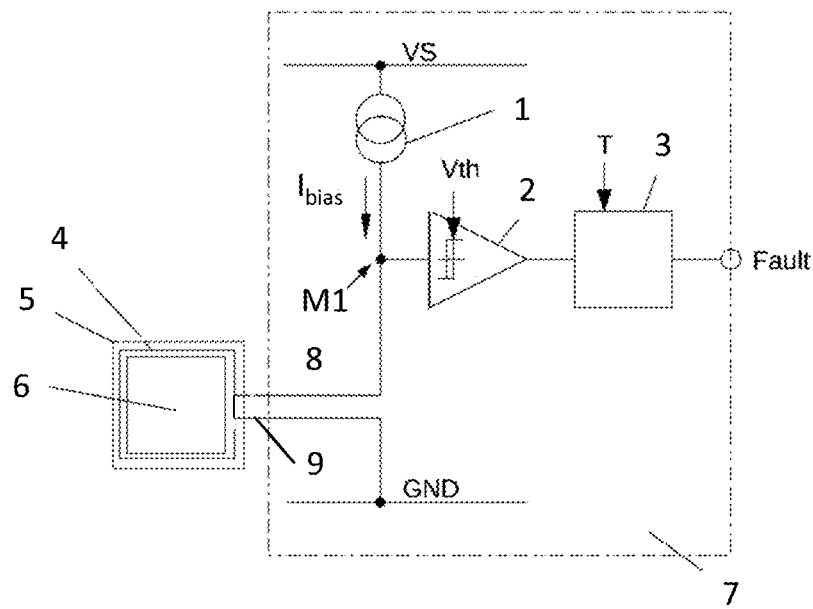
FIG. 1 is a schematic circuit configuration according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "semiconductor devices", reference is made to devices comprising semiconductor material such as silicon, and/or germanium, compounds with semiconducting properties such as III-V compounds, as well as doping elements, etc.

Where in embodiments of the present invention reference is made to a "chip" or "IC" (Integrated Circuit), reference is made to a semiconductor die comprising an electronic device. A chip is usually obtained from a die cut from a semiconductor wafer, and it comprises an active area which gives the function to the chip (e.g. logical gates, transistors, amplifiers, metallization layers, electrodes, contacts, etc.). If different functionalities are obtained in a single die, it is said that the die comprises monolithic integrated circuitry.

The invention relates to functional safety applications, specifically with electronic systems requiring that any possible failure that might happen therein, or during the lifetime of the system, is diagnosed and reported to a higher-level system, which takes measures to put the application into a safe state. Embodiments of the present invention allow monitoring the semiconductor die edge and detect any damages (e.g. mechanical damages such as for instance cracks) before they reach the active area. Accordingly, the present invention provides a system for monitoring the edge status during the lifetime of an integrated circuit. It additionally provides a reliable integrated circuit with fail-safe measures, ensuring that the monitoring system is not prone to be erroneously triggered if no cracks in a conductive material (e.g. metal interconnect or a poly interconnect) in a surrounding loop are present, but which shall reliably be triggered when a crack is present in the conductive material of the loop. It additionally provides a method for monitoring an IC edge and detecting any crack therein, and forcing the IC to a safe state if damage is detected.

The monitoring is realized by conductive loops that surround the active circuit on the semiconductor die: in case of relevant mechanical die edge damage, a signal is generated and the active circuit shall be forced to 'safe state' by means of e.g. a control system. Thus, embodiments of the monitoring system are not only used during test steps during manufacturing of semiconductor devices; they can also be used during the whole life time of the device, which is advantageous for functional safety applications.

In the context of the present invention, the damage which is detectable refers to different root causes for failures, including cracks but also to other damages, such as for instance so-called "stress voids". When a trace around the die is made with a connection layer with a relatively small width, and the die is under stress, "stress voids" may occur. Such stress voids create holes in the connection layer, and can easily completely interrupt the trace. If the trace is interrupted, also other metal lines inside the chip under stress might be interrupted, hence the reason why a signal indicative of edge damage should be generated.

Additionally, the conductive loops are arranged so that the electromagnetic (EM) interference is minimum. For example, the conductive material may provide two opposite conductive paths, one adjacent to the other, for example, a single bifilar trace. It may also comprise high resistance portions, reducing or avoiding self-resonance.

The present invention thus can provide die edge integrity monitoring with reduced susceptibility against electro-magnetic interferences (e.g. RF injection, ESD pulse injection) by interference signal compensating arrangement of the monitor's conducting loops.

In a first aspect, the present invention relates to a damage monitoring system for an integrated circuit provided on a die. The die may be carrier of an active region, for example a semiconductor substrate comprising a chip. For example, it may be a silicon die, although other semiconductor material can be used. The system can detect mechanical damages in the die edge, such as propagating cracks, by detecting changes in the conductivity of a conductive trace surrounding the active region of the die. The invention is suitable to detect cracks propagating from the bulk to the surface at the die edge, from surface to bulk, from the die edge to the inner block of the die (horizontal propagation), and even delamination. The system is adapted to send a test signal through a conductive trace at the edge of the die and to monitor the returned test signal in a detection circuit. If the difference between the test signal and a reference surpasses a predetermined and tunable threshold, the detection circuit can provide a fault signal.

In embodiments of the present invention, the test signal may be a current, for example a current pulse, or a DC current generated by a signal source such as a current source, which may be connected to a power supply, e.g. an external power supply. The signal source may be external, or may be part of the detection circuit. For example a low-intensity current can be used to reduce or avoid heat damage; or it may be a current pulse of any suitable shape (e.g. rectangular, triangular, sinusoidal, e.g. preferably a signal that would cause the least of transient and antenna effects), and/or a series of pulses. The shape of the pulse or pulses depends on the application. If low emission is required, then a DC current is the best choice. In noisy environments, a modulated signal might be preferable. The present invention may be adapted to use any other type of signals, such as a voltage signal provided by a voltage source (e.g. a voltage source and a PWM, etc.). If a voltage source is provided to provide the signal, then a current comparator should be used.

In embodiments of the present invention, the conductive trace comprises at least two conductive paths, each conductive path adjacent to the other and isolated from each other except on the extremes (which may contact other conductive paths), for propagating the test signal in opposite directions. Thus, the test signal would propagate in one direction through the first path, and it would propagate in the opposite direction through the second, adjacent, path. For example, the signal will follow a first direction in a first path and will return in the opposite direction, through an adjacent path. Two of the conductive paths are connected, in one extreme, to a first and second terminal, and in the other extreme, to each other (and/or to further conductive paths, if the conductive trace comprises more than two conductive paths). For example, the conductive trace may have a bifilar configuration. The conductive trace may for example comprise two paths, or four, or more. Such arrangement may provide compensation of EM interferences. The conductive trace may comprise an even number of interconnected paths. For example, in case a conductive trace comprises four paths, the first will be connected to a first terminal, and at the opposite extreme to a further path. These further paths will be connected in the opposite extreme to a third path, which shall be connected to a fourth path. The opposite extreme of the fourth path is connected to the second terminal.

The conductive trace surrounds the active area of the chip, preferably near the die edges. If a damage e.g. crack appears, it will disturb or disrupt the conductive trace, e.g. the plurality of conductive paths, and the signals travelling therein will also be detectably disturbed.

The conductive trace may be placed next to the seal ring of the die, or between the seal ring and the ground routing, but other positions are allowed as long as it is suitable to detect cracks before they affect the active area of the chip.

The conductive paths may be coplanar, for example all on top or in the bottom, or within the die. In other embodiments, the conductive paths may be distributed through different levels or layers of the die. For example, the first path may surround the active area on top of the die, and the second path may return on the bottom of the die, adjacent to the first path, e.g. following the same projected layout as the first path (top-bottom projection). The two paths may be connected through a conductive path extending from top to bottom of the die, for example though the semiconductor substrate of the die. In further embodiments, a pair of conductive paths may be coplanar, while a second interconnected pair of connected paths is not.

In some embodiments of the present invention, the conductive trace may comprise a higher resistance conductor, with a resistance value of more than 100 $\Omega$, e.g. 1 or 10 $\Omega$, in order to reduce or suppress self-resonance effects. The resistance value depends on the specific sheet resistance of semiconductor technology used and on the particular interconnect dimensions. For example, the traces may comprise any resistive layer, e.g. polycrystalline semiconductors, such as polysilicon or doped resistant layers in the substrate. These different materials may have different sheet resistances However, the present invention is not limited to polysilicon. Alternatively, any connection layer used in the technology may be used for the conductive trace, for example, metal routing layers such as for instance Aluminium, Copper, Gold, NiPd. Also n-well resistors in a p-substrate, or p-well resistors in an n-substrate can for instance be used.

One or both terminals of the conductive trace may be connected to a detection circuit or parts thereof. For example, a first terminal may be grounded. The ground may be part of the detection circuit, or may be external grounding. The ground may be a ground different from the chip grounding (thus reducing common ground effects), or may be the same (thus allowing obtaining a compact configuration). For example, a second terminal may be connected to the detection circuit (e.g. it may be connected to a node comprising connection to a comparator and to a signal source, such as a current source). In alternative embodiments, the first terminal may be connected to a power supply and a comparator, while the second terminal may be connected to the signal generator (e.g. a current source connected to ground). This configuration would provide the voltage drop towards the power supply.

The detection circuit in embodiments of the present invention comprises a signal comparator. The signal comparator may be a voltage comparator, such as e.g. a Schmitt trigger. The signal comparator may retrieve the signal from the terminals and compare it to a pre-set threshold. For example, the detection circuit may read the voltage drop in a node, and compare it to a predetermined threshold voltage. If a modulated test signal is used (e.g. a sinusoidal signal), then a demodulator such as a rectifier, and a filter such as a low pass filter may additionally be required. The output of the filter can be compared to a threshold value. In particular embodiments of the present invention, the sensor signal can be digitized, e.g. by an available on-chip analog-to-digital converter, and the comparison can be done with a tuneable threshold, by means of a digital comparator.

The detection circuit may provide an output indicating the status of the conductive trace and any possible disruption thereof. Thus, the output is an indicator of the edge integrity. If a damage forms, or an existing damage expands, it will disturb the conductive trace, and it will be detected in the output as a fault signal.

The fault signal can force a further action to be performed, such as setting off an alarm, switching the chip off, or forcing the chip into a "safe state". For example, a controlling system may process the fault signal and process an action or series of actions to prevent a malfunction of the chip, or of the overall system in operation. The monitor system may be preventive or immediate. For example, the controlling system may be an integrated circuit device test system, or a wafer probing system, which is suitable for detecting crack formation during die cutting and handling, or a final-test system for testing assembled or packaged devices. The system may comprise the conductive trace around the active area, and an external detection circuit may test each die obtained from a wafer. These embodiments are mainly preventive. In other embodiments, an immediate way of operation can be obtained, for example connecting the conductive traces to an external system (e.g. $2^{nd}$ integrated circuit or discrete electronic circuit). Alternatively, the system may be implemented in a portion of the integrated circuit on the same die, e.g. in a portion distant from die edges in which damages (e.g. cracks) tend to appear. These embodiments can monitor the die while the electronic device is in use, for example during part or whole of the lifetime of the electronic device.

The detection circuit may comprise further features such as a debouncing unit, which may receive the signal from the comparator and provide the output signal. Parameters of the debouncing unit, such as the debouncing time T, can be programmed. Short spikes and pulses can be suppressed by this unit, and it increases the robustness against electrostatic discharges (ESD) and EM interference of noise sources, of the monitoring system, and of the chip. In embodiments of the present invention, a resistor-capacitor debouncer or a digital debouncer via a counter can be used. Software debouncing can be implemented if a microcontroller is available on the die.

In embodiments of the present invention, at least part of the edge monitoring system may be integrated in the die. For example, at least the conductive trace may be integrated and laid out at the edges of the die. The rest of the system may be located outside of the integrated circuit. In alternative embodiments, the monitoring system may be integrated in the same chip, as a monolithic device. In yet other embodiments, parts of the detection circuit may be integrated in the same chip (e.g. the current source, the comparator) and the rest of the detection circuit may be outside of the chip (e.g. the debouncing unit).

A single chip may also comprise two or more monitoring systems according to embodiments of the present invention. For example, a first system may include a coplanar conductive trace on top of a die, and a second system may include a coplanar conductive trace at the bottom of the same die.

Some exemplary, non-limiting embodiments of the present invention and parts thereof are schematically shown in the appended drawings.

Figure 2:
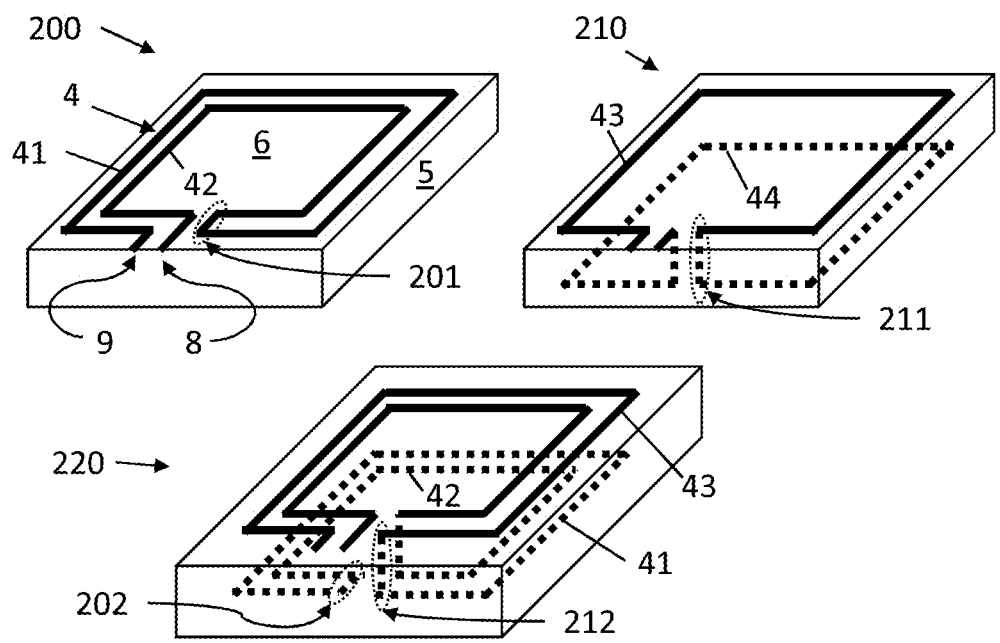
FIG. 2 illustrates exemplary layouts of conductive paths of a conductive trace according to embodiments of the present invention.

FIG. 1 shows a general schematic circuit configuration of an embodiment of the present invention. A current source 1, powered by a supply trace (e.g. an external trace Vs) is connected to a programmable comparator 2, the output of the comparator being connected to a programmable debouncing unit 3. The current source 1 and comparator 2 (in the present case, a Schmitt trigger) are both connected, via a node M1 between them, to a terminal of a conductive trace 4. The current source 1 provides a test signal as a bias current to the conductive trace 4 arranged, for example, in a bifilar approach, as shown in FIG. 2. The conductive trace 4 is positioned along the edge 5 of a die, enclosing the active area of a semiconductor device 6 except for a small gap that can be disregarded, as it can be made small or in small overlap, without electric contact, reducing to substantially zero the chances that an undetected damage e.g. crack may extend through such gap.

In some embodiments of the present invention, the bias current $I_{bias}$ from the current source 1 will generate a voltage drop that can be measured with the comparator 2 by comparing the voltage at node "M1" with a reference voltage Vth. The reference voltage Vth may be settable or programmable. The logical output of the comparator, e.g. the Schmitt trigger, is sent to a debouncing unit 3. The debouncing unit 3 is any kind of hardware or software that ensures that only a single signal will be acted upon when receiving the comparison signal from the comparator 2. The debouncing time T, which characterizes the debouncing action of the unit 3, may also be programmable. The current source 1, comparator 2 and debouncing unit 3 form the detection circuit 7. However, other elements may be included in the detection circuit 7, such as grounding connections; also some elements may be external, such as e.g. the signal source 1.

Three alternative embodiments of the layout of conductive paths forming a loop around a chip are shown in FIG. 2. In the upper left drawing 200, the conductive trace 4 comprises two adjacent and coplanar conductive paths 41, 42 along the edges 5, surrounding the active area of the semiconductor device 6. They are connected to one another through the connecting portion 201 at the extremes opposite to the terminals 8, 9 that connect to the detection circuit, and are isolated from each other elsewhere. In the upper right drawing 210, the adjacent conductive paths 43, 44 are not coplanar, but extend along the edges 5 at the top and bottom of the die. The connecting portion 211 between the conductive paths 43, 44 is located through the thickness of the substrate of the die.

Multiple loops can be made, for example more than two adjacent conductive paths can be provided to form a single conductive trace. These may be coplanar or they may have a multi-layered structure, comprising more than two conductive paths, for example one at the bottom, one at the surface, and another two embedded within the substrate. Also, a hybrid path structure, such as the one shown in the bottom drawing 220, can be obtained, for example providing connecting portions 202 between adjacent pairs of coplanar conductive paths 41, 42 and connecting portions 212 between adjacent pairs 41, 43 of conductive non-coplanar paths.

Figure 3:
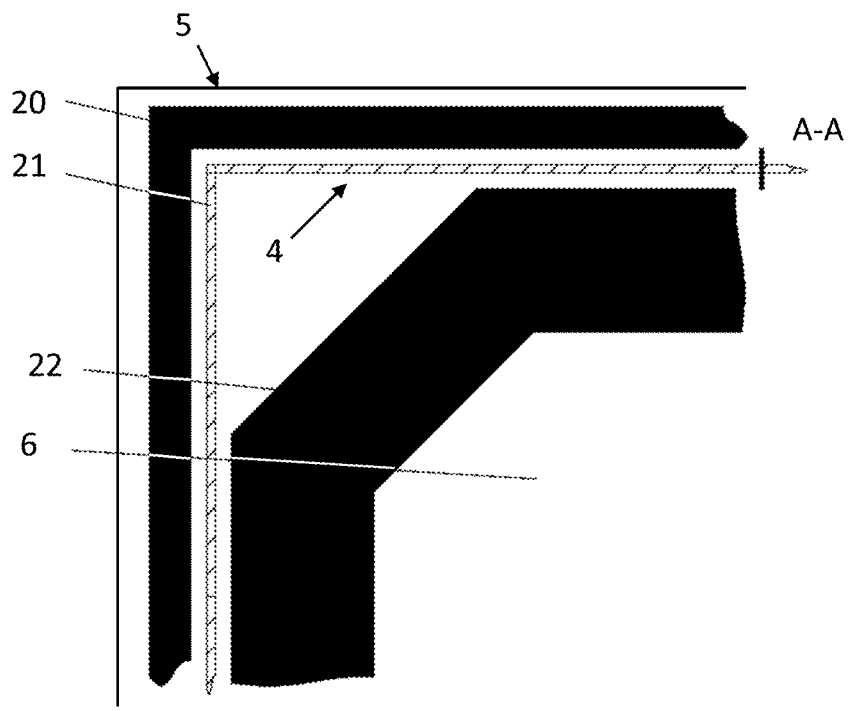
FIG. 3 illustrates a detail of a stacked conductive trace according to embodiments of the present invention.

FIG. 3 shows an implementation of a conductive trace 4 along an edge 5 comprising a further seal ring 20. The conductive trace 4 comprises a stack 21 of multi-layered conductive paths, between a conductive seal ring 20, for instance a metal seal ring such as an aluminium seal ring, and conductive rings 22 for power or ground routing, for instance metal seal rings such as aluminium seal rings, surrounding the active area of the semiconductor device 6. The arrangement of the stack 21 follows closely the shape of the seal ring 20 and not the shape of the rings 22 for power or ground routing. Thus, the conductive paths may be fitted to die corners. This implementation is advantageous because usually damages e.g. die cracks start at the silicon die corner, so they can be detected early.

Figure 4:
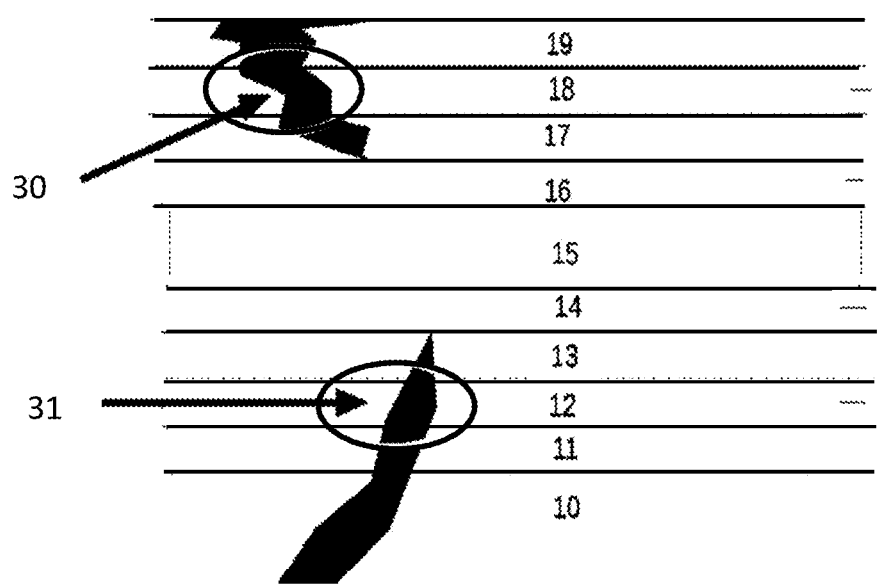
FIG. 4 illustrates a cross-section of the conductive trace of FIG. 3.

FIG. 4 shows the multi-layered structure of the stack 21 according to the cross-section A-A of FIG. 3. In an exemplary embodiment, the multi-layered structure comprises a wafer substrate 10 (e.g. semiconductor such as silicon, germanium, etc.), a dielectric layer 11 (e.g. silicon field oxide, silicon dioxide, or in general a thin dielectric), a conductive path 12 which may have a relatively high resistance (e.g. polysilicon, suitably doped or degenerated semiconductors, etc.), intermetallic dielectric 13 (e.g. silicon oxide), a metal 14 acting as a conductive path (e.g. aluminium), further conductive (e.g. metal) and dielectric layers 15, a further conductive path 16 (e.g. aluminium), an intermetallic dielectric 17 (e.g. silicon oxide), a top conductive path 18 (top metal, e.g. aluminium), and finally a passivation layer 19 (e.g. silicon oxide or silicon nitride). Other configurations, with more or less loops, are possible.

The present invention is not limited to the exemplary stack, and the conductive paths 12, 14, 16 and 18 may comprise all the same metal, or different metal with different resistances, or some may comprise metal and others conductive path comprising semiconductors, or all paths may comprise conductive semiconducting material (e.g. polysilicon, semiconductors with such doping levels that degeneration is reached) or any other suitable conducting material, even conducting materials based on topological conduction such as 2D conduction. Analogously, dielectric layers 13, 14, 17 may comprise any suitable dielectric material.

The conductive paths are interconnected in pairs. For example, the first conductive path 12 may be connected in one extremity via a terminal to the ground and in the opposite extremity with the second path 14, the second path 14 may be connected with the third path 16, the third with the fourth and the fourth with the detection circuit 7, e.g. with the comparator 2 and the signal generator. In case of the stacked layer 21, the connecting portions between pairs of conductive paths may be done through apertures in the dielectric layers, e.g. through vertical interconnects (such as the connecting portions 211, 212 shown in FIG. 2).

This improves detection of damages e.g. cracks formed and/or spreading from the bottom or from top, which may be detected early. The present configuration can advantageously detect delamination in some cases, for example by disruption or breaking of the conductive path due to the delamination. The present configuration can advantageously also detect stress voids.

When the monitoring system comprises a debouncing unit 3, the fault signal obtained from the debouncing unit can indicate whether the stack of the conductive layers is broken by for instance a crack that might develop from the top surface of the semiconductor device (top crack 30 in FIG. 4) or from the bottom of the semiconductor device (bottom crack 31 in FIG. 4).

Figure 5:
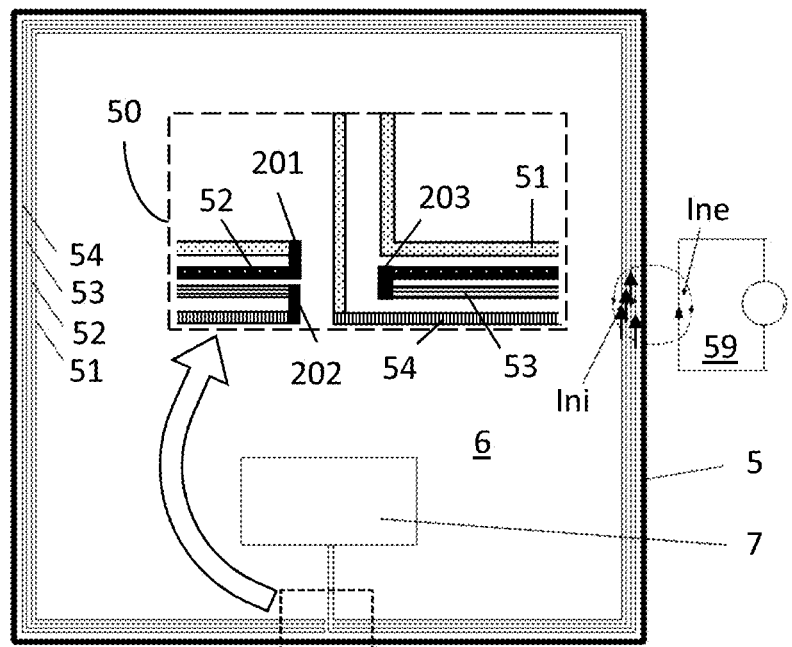
FIG. 5 illustrates a schematic circuit configuration according to embodiments of the present invention comprising a monitoring system for a chip, the detection circuit of the monitoring system being integrated in the same chip.

A coplanar layout of the conductive trace is more suitable to detect horizontally spreading cracks. FIG. 5 shows a structure with a coplanar, rather than stacked, conductive path structure. The coplanar conductive paths 51, 52, 53, 54 are connected via coplanar connecting portions 201, 202, 203 as shown in detail in the zoomed region 50. Moreover, this configuration shows the detection circuit 7 monolithically integrated within the active area of the semiconductor device 6. The system may be provided in the top, bottom or within the thickness of a die. Each conductive path may comprise the same or different conductive material (thus, some conductive paths may show different resistance than others). The conductive material may comprise metal, polysilicon, degenerate semiconductors with the same or different levels of doping, etc. For example, the conductive path 51, forming the loop closest to the centre to the active area, may comprise e.g. conductive semiconducting material, for example obtained directly from the substrate by selectively doping it in selected zones, shaping the conductive path. The first loop is also connected to the integrated detection circuit 7. The coplanar connecting portion 201, which may also be semiconducting material or metal, connects the first loop with the second loop. Second and third and third and fourth loops formed by the rest of conductive paths 52, 53, and 54 may be obtained from semiconductor material as before, or they may be obtained by depositing or otherwise providing a metal layer or strip.

The conductive paths form a network of inductors, which are suitable to reduce the influence of interferences and other sources of noise. Interference may have several effects:

external noise sources can affect the detection of cracks, e.g. by masking the detection the conducting trace of the system may produce antenna effects and interfere with other devices and, more importantly, external sources may produce disruption in the test signal and trigger an unwanted fault signal, produced not by cracks, but by injected currents.

The first effect may be counteracted by performing more than one test, even after a crack has been detected for first time, and do an average, majority voting, or other suitable data treatment chosen according to the circumstances.

The antenna effect of the system can be reduced with the bifilar arrangement and a low signal amplitude or by means of a suitable test signal shape.

The interference from external noise can be demonstrated, as shown in FIG. 5, as the injection of a noise current (Ini, standing for "I noise injected") from an external noise source 59 (Ine, standing for "I noise external") via an inductive and/or capacitive coupling. The noise source represents any magnetic or electric field that might act on the semiconductor device during the lifetime (e.g. during use) of the chip. The conductive paths (either stacked as in FIG. 4, or coplanar, as in FIG. 5) will generate also a magnetic field acting against the incoming magnetic field and the magnetic fields of the conductive layers themselves, so that the voltage at node "M1" (at the terminal 8 connected to the comparator) stays undisturbed within a predetermined range. In order to ensure this approach, it is advantageous that the number of conductive paths is an even number, with a minimum number of two.

In some embodiments, it is advantageous that paths are adjacent to each other (e.g. in a bifilar configuration).

Thus, parasitic emissions and injections due to antenna effects and other interferences and noise can be reduced or avoided.

In some embodiments, higher resistive polysilicon conductive loops are included in the conductive trace (e.g. as a conductive path or part thereof), which shall lower or avoid any possible self-resonance effects (improving damping, obtaining a low quality resonant factor), which ultimately improves immunity against injected current from radio frequency signals. This advantageously reduces the chance of, or avoids altogether, any unwanted triggering of a fault signal In a second aspect, the present invention relates to an integrated circuit provided on a semiconductor (e.g. silicon) die comprising a monitoring system according to embodiments of the first aspect. For example, a chip may comprise at least two conductive adjacent paths around the die edges. The plurality of adjacent paths are connected in pairs, forming a single conductive trace. The free extremes of the conductive trace 4 are connective terminals 8, 9, as shown in FIG. 2, thus, a conductive trace 4 comprises a plurality of conductive paths 41, 42, 43, 44, connecting portions 201, 211 and two terminals 8, 9. For example, the conductive trace 4 may form a bifilar trace, which may extend around the die edges forming one or more loops. The conductive paths may comprise any suitable conductive materials such as properly doped semiconducting material and/or metal. Different paths may show different conductivity, thus reducing self-resonance.

In some embodiments, the number of conductive paths are advantageously even. For example, the conductive paths may form a conductive trace with a bifilar configuration.

Embodiments according to the second aspect of present invention may comprise circuits for automobile applications. Possible applications include, but are not limited to, sensors and CPUs for instance. Any application is possible. It depends on commercial aspects and system requirements. If the integrity of the die is harmful to e.g. the safety of a system (e.g. if a sensor would deliver a wrong signal, or an actuator would initiate a dangerous action) then the monitoring system according to embodiments of the present invention brings an advantage.

In some embodiments, the layout of the conductive paths is coplanar, which is easy to provide. For instance, two conductive coplanar paths may be provided, on top and bottom of the die. In other embodiments, the conductive path layout may be in a multilayer configuration, obtaining a compact configuration. Stacked integrated circuits may include depositing a conductive path (e.g. by masking or in any other suitable way) at the edges of the die while providing each layer forming the stack, and then providing a vertical interconnect between pairs of conductive paths forming a single conductive trace.

The integrated circuit according to embodiments of the present invention comprises connections or terminals 8, 9 adapted to connect the conductive trace with a detection circuit 7. For example, one terminal of the trace may be connectable to ground, either the chip ground or an external ground, while the other may be connectable to the external comparator 2 and signal generator 1 of the system of an external detection circuit, which comprises a readout terminal. The present invention is not limited to these exemplary embodiments, and the detection circuit may comprise other features, such as a debouncing unit 3 which may comprise flip flops, logic gates, etc.; the detection circuit may also comprise connection to external power supplies, etc. This configuration of external detection circuit can be advantageously used as a monitoring system during manufacture, because then it can be disconnected and the chip is left with only the conducting trace, which does not occupy a lot of space and may have other functionalities such as grounding, etc. The detection circuit may also be left connected to the chip for providing monitoring during the whole life of the chip.

In some embodiments, the integrated circuit may not only comprise the conductive trace connectable to a detection circuit, but it may also comprise the detection circuit monolithically integrated in the same chip, obtaining a stand-alone chip which may only need external connection to a power supply. This is advantageous in case the monitoring is required during the whole life of the chip, because it is integrated and does not require extra space. In case very harsh conditions are expected and cracks may extend rapidly and affect the monitoring system, more than one system may be included in the chip, and/or the detection circuit 7 may be external.

In a third aspect, the present invention relates to a method of monitoring the integrity of a semiconductor die edge during processing and optionally during the lifetime of an integrated circuit included in said die.

In some embodiments, damages of the die edge (e.g. propagating cracks) can be detected by monitoring the conductivity of conducting loops that are arranged around the integrated circuit. In some embodiments, the detection of a crack can trigger a response of a controlling system.

In some embodiments, monitoring is performed during manufacturing and/or before shipping. A device test can be performed for detection of die cracks, before the IC is released or delivered to customers.

In some embodiments, monitoring can additionally or alternatively be performed during the lifetime of the device. An early detection of die-edge-induced and potentially propagating die cracks is possible. The method may further include the generation of a fault signal upon detection of a crack. Embodiments of the present method include actively forcing the integrated system to a 'safe operating mode'/ 'safe state' upon detection of a crack.

Embodiments of the present invention present a robust method against EMC and/or ESD disturbances which might happen during use of the circuit. A wrong triggering of the monitoring system can advantageously be avoided.

Figure 6:
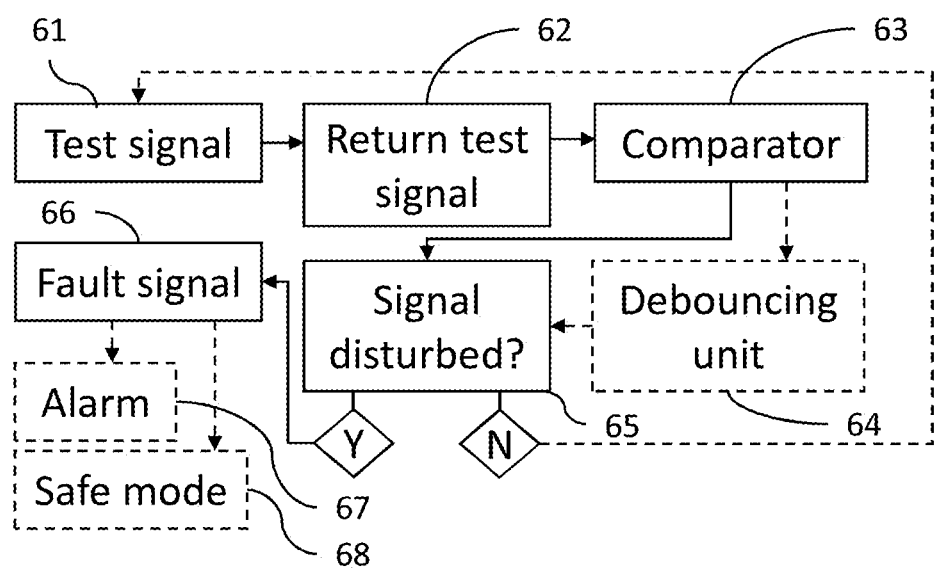
FIG. 6 shows a flowchart of an embodiment of the method of the present invention.

FIG. 6 schematically illustrates steps of a method according to embodiments of the present invention. The method comprises generating 61 a diagnosis or test signal, e.g. during manufacture, periodically, while in use, or under other programmable and predetermined circumstances (e.g. triggered by external systems such as pressure, motion or temperature detection circuits). The test signal is introduced through a first terminal 8 in the conductive trace 4 through a conductive path surrounding the die edge. The signal then returns 62 through a different conductive adjacent path, also surrounding the die edge. If more than one loop is envisaged, the signal can move forward and back over a plurality of adjacent conductive paths. The signal returning through the second terminal 9 of the conductive trace is sent 63 to a comparator. Depending on the type of signal, the comparator may be a current pulse comparator, a voltage comparator, etc.; for example, it may be a Schmitt trigger. The parameters of comparison can be programmed, selecting the threshold of allowed difference between the test signal and a programmable reference signal. For example, the voltage threshold can be programmed. The comparator may optionally send 64 the signal to a debouncing unit, which can sort out short spikes and pulses. The reference voltage Vth adjustment of the comparator ensures a good working point of the read out circuit detection circuit 7. Thus, a robust operation regarding EMC or ESD can be obtained by choosing appropriate values of debouncing time T and programmable voltage level Vth. Two outcomes are obtained 65:

If the return test signal is disturbed or disrupted more than a predetermined extent (determined by the deviation with respect to the reference signal being more or less than the selected threshold), it means that a serious disruption occurred along the conductive trace due to a damage e.g. crack. A fault signal is then generated 66.

If, on the other hand, no crack is detected, the test is finished and may optionally restarted after a predetermined time period or is running continuously.

In some embodiments, the die edge test is performed during IC testing at the end or during chip manufacture. If a damage is detected, the fault signal triggers 67 an alarm signal, which can alert the manufacturer (or a high level automatized system) of presence of damages, thus allowing discarding the damaged die at an early stage (e.g. before packaging).

In some embodiments of the present invention, the test can periodically be performed again during the whole lifetime of the device or until a damage is detected. If the test is performed periodically, then the period must correspond to the maximum detection time requirement of the application. Alternatively, the test can be performed continuously, e.g. using a low-intensity continuous current through the conductive trace. For instance, a continuous DC current may be sent through the sensor, and the output voltage may be continuously monitored. In such embodiments, if a damage, e.g. crack, is formed, or an existing small damage expands towards the active components within the die, the fault signal can trigger 67 an alarm signal. Alternatively or additionally, the fault signal can trigger a controller to force 68 the integrated circuit into a safe state.

Embodiments of the present invention advantageously comply with the standard of functional safety for automobile applications according to ISO26262.

The invention claimed is:

1. A method of monitoring edge integrity of a semiconductor die comprising a semiconductor device, the method comprising the steps of:
   introducing a test signal in a conductive trace through a first conductive path surrounding a die edge,
   monitoring a return test signal through a second conductive path surrounding the die edge and electrically connected to the first conductive path via an extremity, and comparing the returned signal with a reference signal, and
   generating a fault signal if the output of the comparison exceeds a predetermined threshold;
   wherein said introducing the test signal in the conductive trace comprises introducing the test signal in the conductive trace further comprising high resistance portions with a resistance of at least 1 kΩ adapted for reducing self-resonance; and
   wherein the conductive trace further comprises polysilicon.

2. The method according to claim 1, further comprising introducing the output of the comparison in a debouncing unit.

3. The method according to claim 1, wherein introducing the test signal comprises introducing a test current, monitoring the return test signal comprises monitoring the voltage drop in the conductive trace, and comparing the return signal with a reference signal comprises comparing the voltage drop with a reference voltage Vth.

4. The method according to claim 1, wherein introducing the test signal comprises applying a test voltage, monitoring the return test signal comprises measuring a reply current in the conductive trace, and comparing the return test signal with a reference signal comprises comparing the reply current with a reference current.

* * * * *